United States Patent
Sanghvi et al.

(10) Patent No.: US 11,487,304 B2
(45) Date of Patent: Nov. 1, 2022

(54) PROCESS FLUID PATH SWITCHING IN RECIPE OPERATIONS

(71) Applicant: Applied Materials, Inc., Santa Clara, CA (US)

(72) Inventors: Mitesh Sanghvi, Sunnyvale, CA (US); Venkatanarayana Shankaramurthy, San Jose, CA (US); Peter Standish, San Jose, CA (US); Anton Baryshnikov, Campbell, CA (US); Thorsten Kril, Santa Cruz, CA (US); Chahal Neema, Santa Clara, CA (US); Vishal Suresh Jamakhandi, Sunnyvale, CA (US); Abhijit Ashok Kangude, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 107 days.

(21) Appl. No.: 17/248,106

(22) Filed: Jan. 8, 2021

(65) Prior Publication Data

US 2022/0221880 A1    Jul. 14, 2022

(51) Int. Cl.
| | | |
|---|---|---|
| *G05D 7/06* | (2006.01) | |
| *G05B 19/042* | (2006.01) | |
| *C23C 16/52* | (2006.01) | |

(52) U.S. Cl.
CPC ........... *G05D 7/0623* (2013.01); *C23C 16/52* (2013.01); *G05B 19/042* (2013.01);
(Continued)

(58) Field of Classification Search
CPC .. G05D 7/0623; G05D 7/0625; G05B 19/042; C23C 16/52
(Continued)

(56) References Cited

U.S. PATENT DOCUMENTS

| | | | |
|---|---|---|---|
| 8,017,527 B1 * | 9/2011 | Dhas | ..................... C23C 16/509 |
| | | | 257/E21.477 |
| 9,145,605 B2 | 9/2015 | Masuda et al. | |

(Continued)

FOREIGN PATENT DOCUMENTS

| | | |
|---|---|---|
| EP | 3117023 B | 4/2019 |
| JP | 2015-143383 A | 8/2015 |
| KR | 10-1514159 B1 | 4/2015 |

OTHER PUBLICATIONS

International Search Report and Written Opinion for International Application No. PCT/US2022/011684, dated Apr. 26, 2022, 10 pages.

*Primary Examiner* — Mohammad Ali
*Assistant Examiner* — Joshua T Sanders
(74) *Attorney, Agent, or Firm* — Lowenstein Sandler LLP

(57) ABSTRACT

A method includes identifying time values for a length of time to carry out process fluid delivery within multiple processing chambers that concurrently process multiple substrates; translating each time value to a recipe parameter for execution of an operation of a processing recipe; and causing the operation to be performed using each recipe parameter as a control value to control valves of a fluid panel of the multiple processing chambers. For each processing chamber of the multiple processing chambers: causing the process fluid to flow to the processing chamber for a first period of time corresponding to a first time value; and causing the process fluid to flow to a divert foreline of the processing chamber for a second period of time, the second period of time being based on a timestep of the operation and the time value.

20 Claims, 5 Drawing Sheets

(52) U.S. Cl.
CPC . *G05D 7/0652* (2013.01); *G05B 2219/25252* (2013.01); *G05B 2219/25257* (2013.01)

(58) Field of Classification Search
USPC .......................................................... 700/282
See application file for complete search history.

(56) References Cited

U.S. PATENT DOCUMENTS

| | | |
|---|---|---|
| 10,526,701 B2 | 1/2020 | Kumar et al. |
| 2013/0224381 A1* | 8/2013 | Masuda ............ H01L 21/02197 |
| | | 427/255.28 |
| 2017/0096735 A1* | 4/2017 | Kumar .................... C23C 16/52 |
| 2019/0024233 A1* | 1/2019 | Kumar ................ H01L 21/0262 |
| 2019/0056755 A1* | 2/2019 | Ding ................... G05D 7/0635 |

* cited by examiner

PROCESS FLUID PATH SWITCHING IN RECIPE OPERATIONS

TECHNICAL FIELD

This instant specification generally relates to gas delivery to a processing chamber. More specifically, the instant specification relates to process fluid path switching in recipe operations.

BACKGROUND

Manufacturing of modern materials often involves various deposition techniques, such as Chemical Vapor Deposition (CVD) or Physical Vapor Deposition (PVD) techniques, in which atoms or molecules of one or more selected types are deposited on a wafer (substrate) held in low or high vacuum environments that are provided by vacuum processing (e.g., deposition, etching, etc.) chambers. For example, CVD deposition processes are used for a broad spectrum of applications. Other techniques involve use of process fluids for etching already-existent films on the wafer. These applications range from patterning films to insulation materials in transistor structures and between the layers of conducting metal that form the electrical circuit. Applications include shallow-trench isolation, pre-metal dielectric, inter-metal dielectric, and passivation. They are also employed in strain engineering that uses compressive or tensile stress films to enhance transistor performance through improved conductivity. Depending on the type of film to be deposited on a substrate, a precursor (gaseous or liquid) is delivered to the process chamber where the thermal oxidation or reactions results in depositing the desired film.

Other process fluids (gas or liquids) are also used as process or carrier fluids that transport chemicals or plasmas to the processing chamber for any of these processing techniques. Some processing tools include multi-compartment processing chambers that include multiple slots to separate processing chambers, where each chamber is separately supplied with the process fluid. Best practices in processing multiple substrates in these multiple processing chambers is to vary processing control parameters in various recipe operations such that deposited or etched films are as uniform as possible.

SUMMARY

Figure 1A:
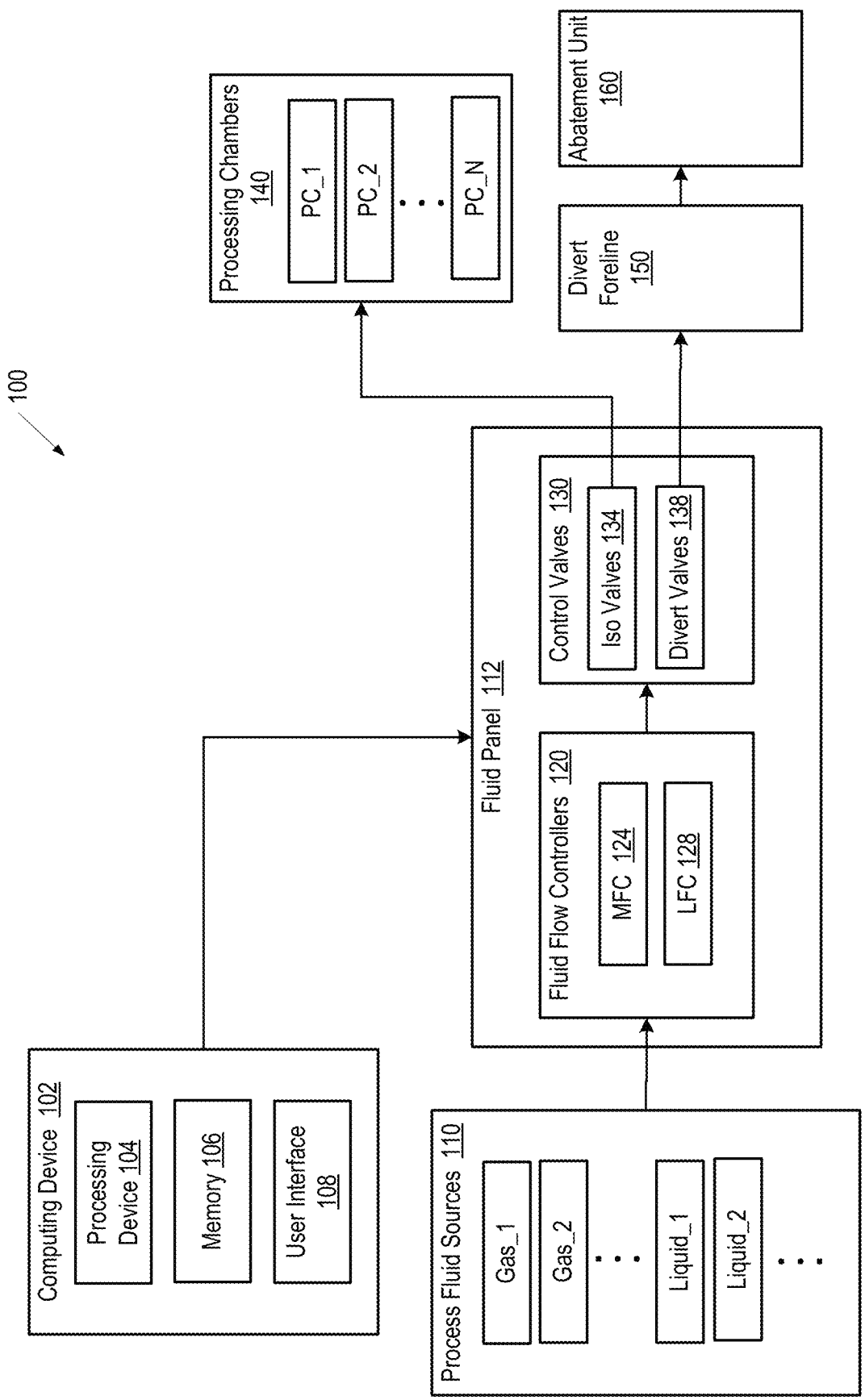
FIG. 1A is a schematic block diagram of an example processing system for process fluid path switching in recipe operations according to some implementations.

In one implementation, disclosed is a method that includes receiving, via a computing device providing a user interface, a set of time values for a length of time to carry out process fluid delivery within multiple processing chambers that are concurrently processing multiple substrates. The method further includes translating, by the computing device, each time value of the set of time values to a recipe parameter for execution of an operation of a processing recipe. The method further includes causing, by the computing device, the operation to be performed using each recipe parameter as a control value to control valves of a fluid panel of the multiple processing chambers. The causing the operation to be performed, for each processing chamber of the multiple processing chambers, further includes: causing the process fluid to flow to the processing chamber for a first period of time corresponding to a time value of the set of time values; and causing the process fluid to flow to a divert foreline of the processing chamber for a second period of time, the second period of time being based on a timestep of the operation and the time value.

In another implementation, disclosed is a system that includes a memory and a processing device, operatively coupled to the memory, to: receive, via a user interface, a set of time values for a length of time to carry out process fluid delivery within multiple processing chambers that are concurrently processing multiple substrates. The processing device is further to translate each time value of the set of time values to a recipe parameter for execution of an operation of a processing recipe. The processing device is further to cause the operation to be performed using each recipe parameter as a control value to control valves of a fluid panel of the multiple processing chambers. To cause the operation to be performed can include, for each processing chamber of the multiple processing chambers: causing the process fluid to flow to the processing chamber for a first period of time corresponding to a time value of the set of time values; and causing the process fluid to flow to a divert foreline of the processing chamber for a second period of time, the second period of time being based on a timestep of the operation and the time value.

In another implementation, disclosed is a non-transitory computer readable storage medium storing instructions that, when executed by a processing device, cause the processing device to perform multiple operations, including receiving, via a user interface, a set of time values for a length of time to carry out process fluid delivery within multiple processing chambers that are concurrently processing multiple substrates. The operations further includes translating each time value of the set of time values to a recipe parameter for execution of an operation of a processing recipe and causing the operation to be performed using each recipe parameter as a control value to control valves of a fluid panel of the multiple processing chambers. The causing includes, for each processing chamber of the multiple processing chambers: causing the process fluid to flow to the processing chamber for a first period of time corresponding to a time value of the set of time values; and causing the process fluid to flow to a divert foreline of the processing chamber for a second period of time, the second period of time being based on a timestep of the operation and the time value.

DETAILED DESCRIPTION

The implementations disclosed herein provide for selective control of sending process fluid to each of multiple processing chambers or diverted to exhaust (or recycle) depending on time values to be programmed for a recipe operation in each processing chamber. Process engineers, in designing and controlling semiconductor processing fabrication tools and systems use Chamber Fingerprinting and Matching (CFM) to improve uniformity of processing across processing chambers. This CFM can be built into the tool control system, which uses sensor data, flow rates, time, temperature values, film thicknesses, and other such information to generate a fingerprint. If the same fingerprint taken at a later time varies in certain ways after initial deployment of the processing system online, the tool control system can vary control parameters that improve uniformity of deposition and etch processing across the multiple chambers. In conventional systems, a lack of sufficient uniformity can decrease the yield of manufactured devices due to defects of in processed substrates.

In some implementations, the present disclosure focuses on control of process fluids, such as gas or liquid used for semiconductor processing, in a way that leads to uniform deposition or etching of films on substrates (wafers) located in multiple processing chambers of the same processing system. In some embodiments, the process fluid is a carrier gas that is to carry another (e.g., process) gas. In one implementation, the multiple processing chambers correspond to multiple processing compartments of a quad processing chamber, each including a slot for receiving a separate substrate. Due to tolerance mismatches in CFM across the multiple processing chambers, the amount of time that a process fluid is sent to each processing chamber of multiple processing chambers can vary. Process fluid lines, however, can get clogged if not causing the process fluid to flow during the entirety of the recipe operation. Thus, the process fluid can be diverted (e.g., sent to exhaust or recycle) when the process fluid is not being directed into a processing chamber. Further, to avoid duplication of the entire process fluid delivery system for each processing chamber (or compartment), the multiple processing chambers share a process fluid source and employ a fluid panel in which a fluid flow controller is employed to send the process fluid to multiple fluid control valves, each corresponding to a separate processing chamber.

In these implementations, a computing device coupled to the fluid panel selectively controls the amount of time each control valve of a set of control valves in the fluid panel either sends the process fluid to a corresponding processing chamber, of the multiple processing chambers, or instead sends the process fluid to a divert foreline to be exhausted, e.g., via an abatement unit. To do so, the computing device first translates a set of time values received via a user interface to a recipe parameter for execution of an operation of a processing recipe. The recipe parameter is then used as a control value for the control valves of the fluid panel. In one implementation, for each processing chamber, the recipe parameter causes the process fluid to flow to the processing chamber for a first period of time corresponding to a time value of the set of time values and causes the process fluid to flow to a divert foreline of the processing chamber for a second period of time. In at least one implementation, the second period of time is based on a timestep of the operation and the time value. For example, the remainder of the timestep of the operation that the process fluid is not directed to the processing chamber can be instead be directed a divert foreline, sometimes referred to as "Divert" herein.

In the disclosed implementations, by precisely controlling the amount of time the process fluid is directed to each of multiple processing chambers (e.g., that form a chamber system, such as a twin or quad chamber), the thickness of film on processed substrates can be more precisely controlled and made uniform across the multiple processing chambers. In this way, the disclosed implementations advantageously lead to increased yield due to a decrease in defects in processed substrates and corresponding manufactured devices. Further, the disclosed implementations enable customized process fluid flow to each processing chamber without the costs associated with duplication of the entire process fluid delivery system for each processing chamber.

Figure 1B:
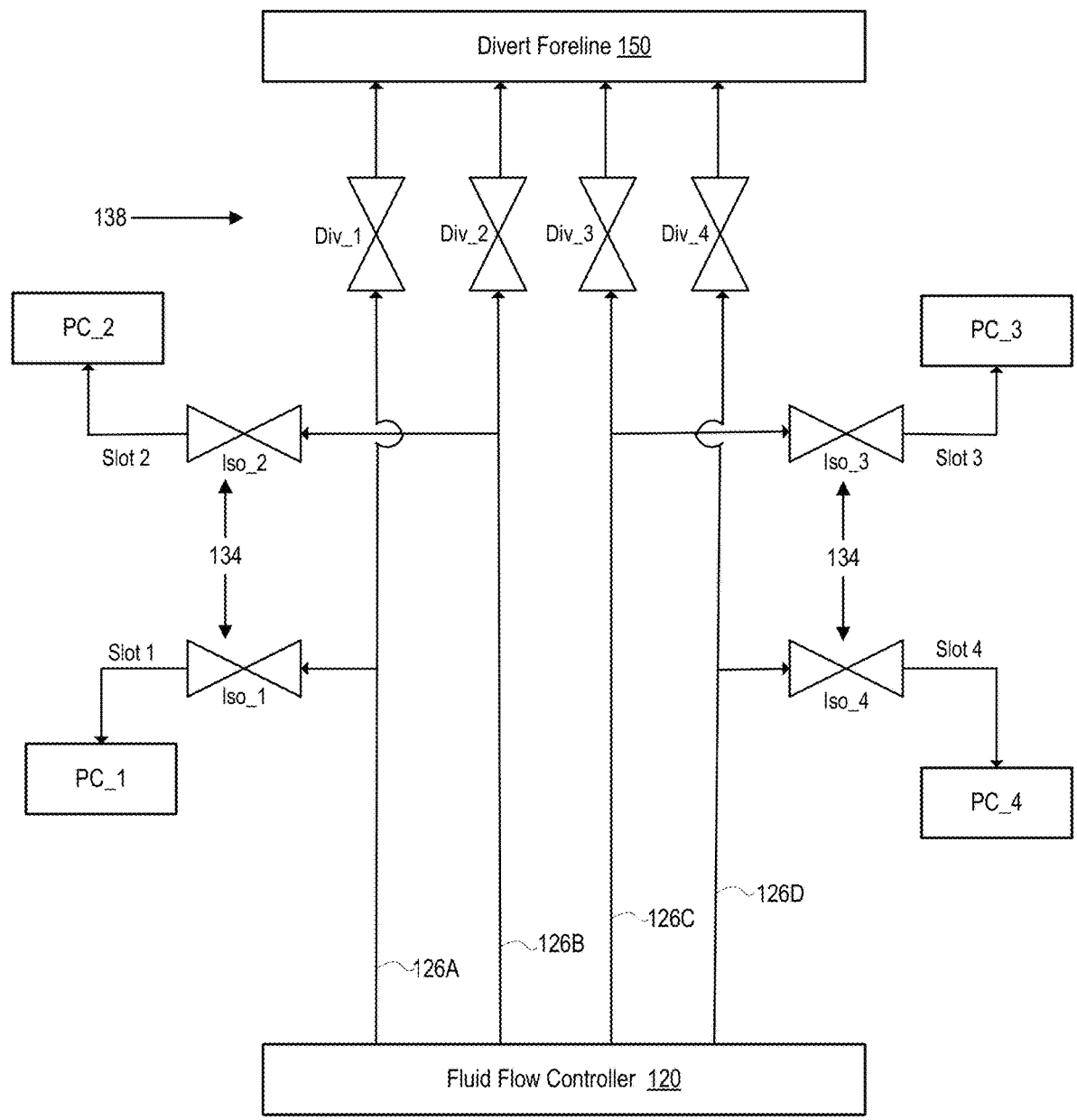
FIG. 1B is a schematic block diagram illustrating additional details of some of the components of the processing system of FIG. 1A according to some implementations.

FIG. 1A is a schematic block diagram of an example processing system 100 for process fluid path switching in recipe operations according to some implementations. FIG. 1B is a schematic block diagram illustrating additional details of some of the components of the processing system 100 of FIG. 1B according to some implementations. In these exemplary implementations, the processing system 100 includes a computing device 102, one or more process fluid sources 110, a fluid panel 112 that includes a fluid flow controller 120 and a set of control valves 130, multiple processing chambers 140 (PC_1, PC_, ... PC_N), a divert foreline 150, and an abatement unit 160. The computing device 102 includes at least a processing device 104, a memory 106, and a user interface 108 (such as a graphical user interface), but a more detailed example computing device is discussed with reference to FIG. 4. The process fluid source 110 includes any number of gases (e.g., gas_1, gas_2, ... ), such as a carrier gas, or liquids (e.g., liquid_1, liquid_2, ... ), which are referred to herein more generally as process fluid sources. The fluid panel 112 mixes one or more of the process fluids provided by the process fluid sources 110 before controlling delivery thereof through the set of control valves 130.

In various implementations, the fluid panel 112 includes one of more fluid flow controllers 120 and a set of control valves 130. The one or more fluid flow controllers 120 includes a mass flow controller (MFC) 124 for gas and a liquid flow controller (LFC) 128 for liquid. The set of control valves 130 can include a set of isolation valves 134 ("Iso" valves) and a set of divert valves 138 ("Div" valves), illustrated in additional detail with reference to FIG. 1B, which is an example of a quad processing chamber that includes four separate processing chambers. Each isolation valve 134 is coupled to one of the processing chambers 140 and each divert valve 138 is coupled to the divert foreline 150. The divert foreline 150 is coupled to and directs excess process fluid to an abatement unit 160 to be either recycled or exhausted. Although FIG. 1B illustrates a quad processing chamber by way of example, different numbers of processing chambers and corresponding set of control valves 130 are envisioned.

In these implementations, the computing device 102 can be coupled to the fluid panel 112. The computing device 102 includes the processing device 104, which can execute or perform instructions to control process fluid flow from the process fluid source 110 through the fluid panel 112 and to the processing chambers 140 and divert foreline 150. In some implementations, the computing device 102 receives a set of time values (e.g., through the user interface 108) for a length of time to carry out process fluid delivery within the multiple processing chambers (PC_1, PC_, ... PC_N) that concurrently process multiple substrates. The set of time values can either correspond to a divert (or switch) time or to a length of process time. The computing device 102 can translate each value of the set of time values to a recipe parameter for execution of an operation of a processing recipe.

In some implementations, the computing device 102 then causes the operation to be performed using each recipe parameter as a control value to the control valves 130, as will be discussed in more detail. As one example, for each processing chamber of the multiple processing chambers 140, the computing device 192 causes the process fluid to flow to the processing chamber for a first period of time corresponding to a time value of the set of time values, and causes the process fluid to flow to a divert foreline of the processing chamber for a second period of time. The second period of time can be based on a timestep of the operation and the time value. For example, if the timestep (e.g., total time) of the operation is 10 seconds and the time value is 8 seconds for process time, then the first period of time is 8 seconds and the second period of time is 2 seconds. In another example, if the timestep of the operation is 10 seconds and the time value is 3 seconds for divert (or switch) time, then the first period of time is 7 seconds and the second period of time is 3 seconds. Thus, in implementations, a combination of each first period of time and each second period of time equals the timestep of the operation.

With additional specificity, with reference to the implementation of FIG. 1B, a first fluid line 126A is coupled (or connected) to the fluid flow controller 120. A first isolation valve (Iso_1) can be coupled between the first fluid line 126A and a first processing chamber (PC_1). A first divert valve (Div_1) can be coupled between the first fluid line 126A and the divert foreline 150. Each of the first isolation valve and the first divert valve can be said to be mutually exclusive; while both can remained closed, both cannot be opened at the same time. In some implementations, the first isolation valve, the first divert valve, and the MFC 124 is referred to as a first gas (or liquid) stick and is separately controllable by a recipe parameter. A gas/liquid stick is an assembly that includes multiple active devices or fluid flow components used to deliver gas or liquid from the fluid panel 112 to various destinations, such as to the processing chamber 140, to the divert foreline 150, and to the abatement unit 160. Thus, the computing device 102 can generate software control values adapted to control different gas or liquid sticks to direct process fluid along predetermined paths for programmed lengths of time.

Further, a second fluid line 126B is coupled (or connected) to the fluid flow controller 120. A second isolation valve (Iso_2) can be coupled between the second fluid line 126A and a second processing chamber (PC_2). A second divert valve (Div_2) can be coupled between the second fluid line 126A and the divert foreline 150. Each of the second isolation valve and the second divert valve can be said to be mutually exclusive; while both can remained closed, both cannot be opened at the same time. In some implementations, the second isolation valve, the second divert valve, and the MFC 124 is referred to as a second gas (or liquid) stick and is separately controllable by a recipe parameter.

Additionally, a third fluid line 126B is coupled (or connected) to the fluid flow controller 120. A third isolation valve (Iso_3) can be coupled between the third fluid line 126A and a third processing chamber (PC_3). A third divert valve (Div_3) can be coupled between the third fluid line 126A and the divert foreline 150. Each of the third isolation valve and the third divert valve can be said to be mutually exclusive; while both can remained closed, both cannot be opened at the same time. In some implementations, the third isolation valve, the third divert valve, and the MFC 124 is referred to as a third gas (or liquid) stick and is separately controllable by a recipe parameter.

Further, a fourth fluid line 126B is coupled (or connected) to the fluid flow controller 120. A fourth isolation valve (Iso_4) can be coupled between the fourth fluid line 126A and a fourth processing chamber (PC_4). A fourth divert valve (Div_4) can be coupled between the fourth fluid line 126A and the divert foreline 150. Each of the fourth isolation valve and the fourth divert valve can be said to be mutually exclusive; while both can remained closed, both cannot be opened at the same time. In some implementations, the fourth isolation valve, the fourth divert valve, and the MFC 124 is referred to as a fourth gas (or liquid) stick and is separately controllable by a recipe parameter.

Figure 2:
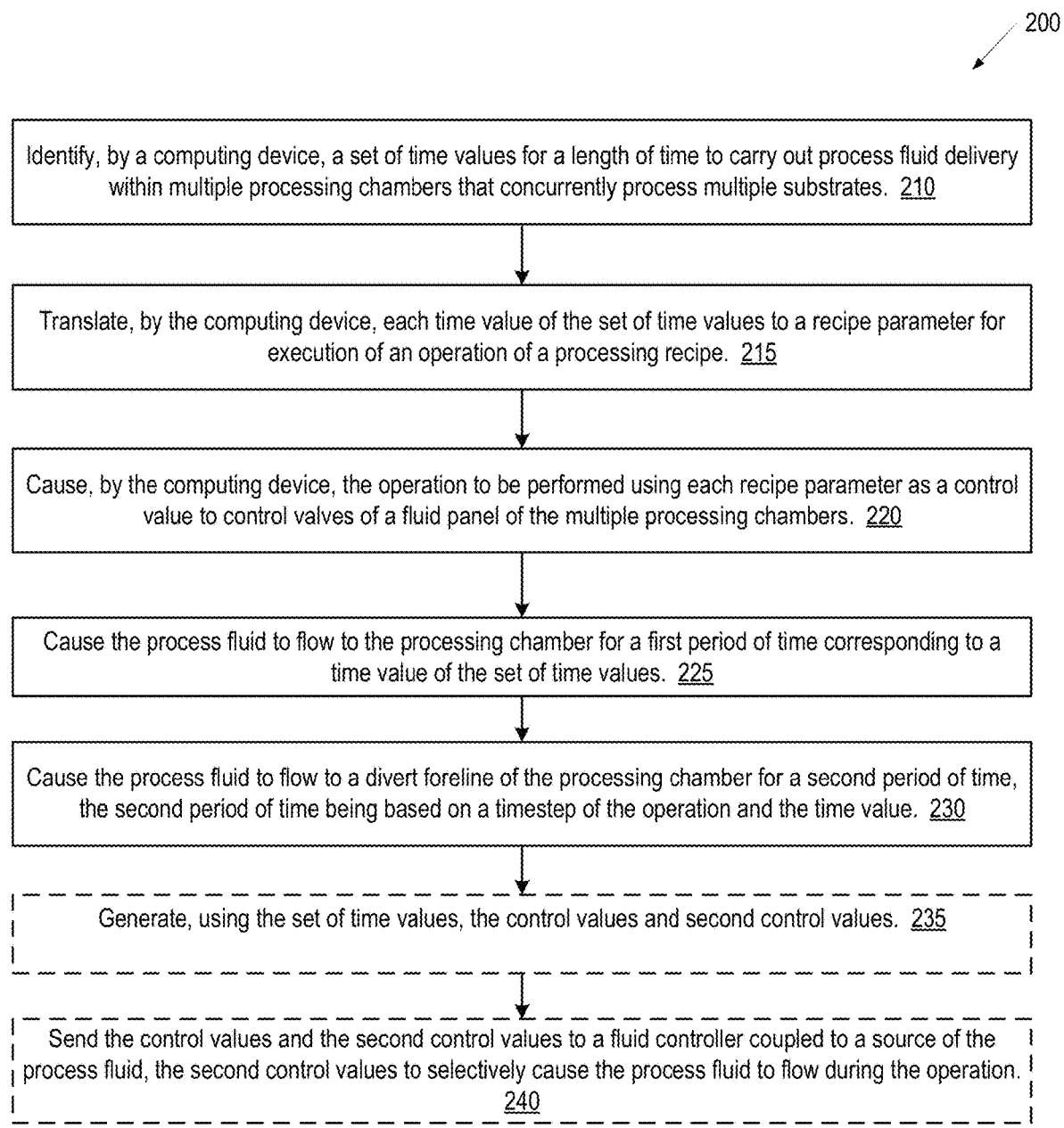
FIG. 2 is a flow diagram of a method for process fluid path switching in recipe operations according to some implementations.

FIG. 2 is a flow diagram of a method 200 for process fluid path switching in recipe operations according to some implementations. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 200 is performed by the processing system 100 and components shown in FIGS. 1A-1B or any combination thereof. The method 200 can be performed using a single processing device or multiple processing devices. Some of the operations of method 200 can be optional, indicated by the dashed lines. In implementations, some operations of the method 200 are performed by the computing device 102 and the processing device 104.

At operation 210, the processing logic identifies a set of time values for a length of time to carry out process fluid delivery within the multiple processing chambers 140 that concurrently process multiple substrates. In one embodiment, the time values are received through the user interface 108. In another embodiment, the time values are pre-stored and are retrieved, e.g., from the memory 106 or other computer storage such discussed with respect to FIG. 4.

At operation 215, the processing logic translates each value of the set of time values (e.g., received via the user interface 108 from an operator) to a recipe parameter for execution of an operation of a processing recipe. In some implementations, the computing device 102 also correlates the set of time values with the process fluid for execution of the operation of the processing recipe, as the time period for flowing the process fluid can vary depending on the process fluid.

At operation 220, the processing logic causes the operation to be performed using each recipe parameter as a control value to the control valves 130 of the fluid panel 112 of the multiple processing chambers 140. The processing logic can direct control of the fluid flow controller 120 (as per operations 235-240) and the set of control valves 130 according to the recipe parameters determined during translation.

For example, at operation 225, the processing logic causes the process fluid to flow to the processing chamber 140 for a first period of time corresponding to a time value of the set of time values. Further, at operation 230, the processing logic causes the process fluid to flow to the divert foreline 150 of the processing chamber 140 for a second period of time, the second period of time being based on a timestep of the operation and the time value.

At operation 235, the processing logic generates, using the set of time values, the control values and second control values. At operation 240, the processing logic sends the control values and the second control values to the fluid flow controller 120 coupled to a source of the process fluid with which to selectively cause the process fluid to flow during the operation or during multiple operations. In one implementation, the source is one or more of the process fluid sources 110.

In various implementations, with further reference to operation 215, the processing logic translates (or converts)

each time value to a recipe parameter that indicates a time period and that has a positive sign or a negative sign. For example, in some implementations, a positive sign directs the fluid panel 112 to cause the process fluid to flow to the processing chamber 140 at the start of the recipe operation, followed by to flow to the divert foreline 150 for the rest of the timestep of the recipe operation. In other words, when the recipe parameter is positive, causing the process fluid to flow to the processing chamber 140 is performed before causing the process fluid to flow to the divert foreline 150.

Table 1 is an example implementation for positively signed recipe parameters, for which the default flow path is "FlowToCh." With reference to Table 1, "mgm" is milligrams per minute flow rate for tetraethyl orthosilicate (TEOS) liquid and "sccm" is standard cubic centimeters per minute flow rate for argon (Ar) carrier gas. Each recipe operation parameter is named "<GasName> Path Switch Time."

TABLE 1

| TEOS-LIQ | 1000 mgm | FlowToCh | | | |
| --- | --- | --- | --- | --- | --- |
| TEOS-LIQ Path Switch Time | 4 s | 3 s | 2 s | 0 s | |
| AR-CARRIER | 500 sccm | FlowToCh | | | |
| AR-CARRIER Path Switch Time | 4 s | 3 s | 2 s | 0 s | |

TABLE 2

| Slot Number | Processing Chamber | Divert |
| --- | --- | --- |
| Slot 1 | 6 seconds to PC_1 | 4 seconds to Divert Foreline |
| Slot 2 | 7 seconds to PC_2 | 3 seconds to Divert Foreline |
| Slot 3 | 8 seconds to PC_3 | 2 seconds to Divert Foreline |
| Slot 4 | 10 seconds to PC_4 | 0 seconds to Divert Foreline |

Based on Table 1, whether the liquid or the carrier gas, Table 2 illustrates how the translated parameters would be interpreted for directing flow within the fluid panel 112, as related to the four processing chambers (PC_1, PC_2, PC_3, and PC_4) of corresponding to the four slots of a quad processing chamber, e.g., first to Processing Chamber, than to Divert for each slot. When the recipe parameter is zero, causing the process fluid to flow to the processing chamber 140 is performed during an entirety of the timestep of the operation of the processing recipe, e.g., here for 10 seconds.

In another implementation, a negative sign directs the fluid panel 112 to cause the process fluid to flow to the divert foreline 150 at the start of the recipe operation, followed by to flow to the processing chamber 140 for the rest of the of the timestep of the recipe operation. In other words, when the recipe parameter is negative, causing the process fluid to flow to the divert foreline 150 is performed before causing the process fluid to flow to the processing chamber 140. Table 3 is an example implementation for negatively signed recipe parameters. Each recipe operation parameter is named "<GasName>Path Switch Time."

TABLE 3

| TEOS-LIQ | 1000 mgm | FlowToCh | | | |
| --- | --- | --- | --- | --- | --- |
| TEOS-LIQ Path Switch Time | −3 s | −2 s | −3 s | −1 s | |
| AR-CARRIER | 500 scc | FlowToCh | | | |
| AR-CARRIER Path Switch Time | −3 s | −2 s | −3 s | −1 s | |

TABLE 4

| Slot Number | Divert | Processing Chamber |
| --- | --- | --- |
| Slot 1 | 3 seconds to Divert Foreline | 7 seconds to PC_1 |
| Slot 2 | 2 seconds to Divert Foreline | 8 seconds to PC_2 |
| Slot 3 | 3 seconds to Divert Foreline | 7 seconds to PC_3 |
| Slot 4 | 1 seconds to Divert Foreline | 9 seconds to PC_4 |

Based on Table 3, whether the liquid or the carrier gas, Table 4 illustrates how the translated parameters would be interpreted for directing flow within the fluid panel 112, as related to the four processing chambers (PC_1, PC_2, PC_3, and PC_4), e.g., first to Divert, then to Processing Chamber for each slot.

Figure 3:
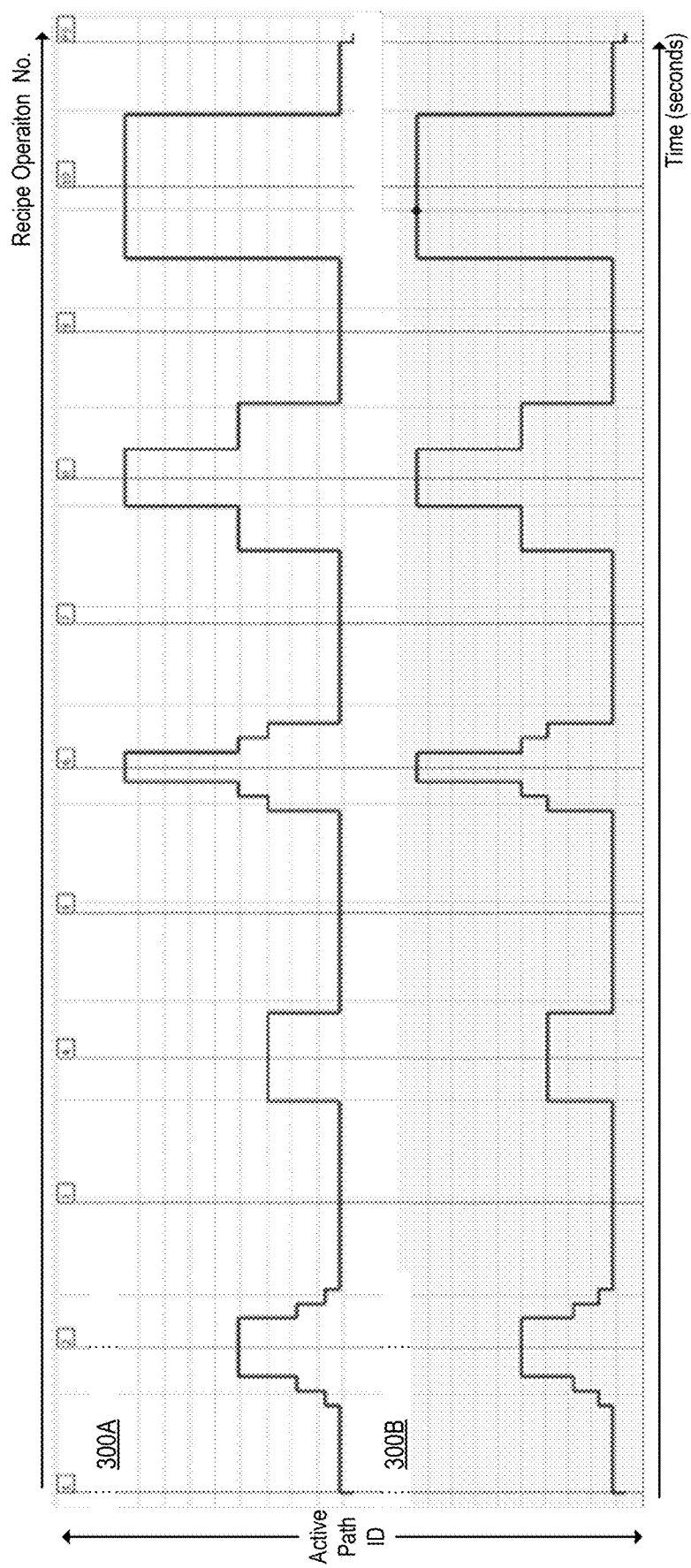
FIG. 3 is a set of graphs that illustrate changes in an active path identifier that drives operation parameter values for process fluid path switching according to some implementations.

FIG. 3 is a set of graphs that illustrate changes in an active path identifier (ID) that drives operation parameter values for process fluid path switching according to some implementations. The active path ID can be, for example, a single encoded value (e.g., from 16 different values) that drives which slot flow destinations (e.g., processing chambers or compartments in a quad processing chamber) are being directed to chamber, to divert, or a combination of chamber and divert for different slots. In various embodiments, each variable graph illustrates how the active path ID changes within the recipe operation being currently run.

In a first graph 300A, the y-axis is associated with the active path ID for a first gas (or liquid) stick, and in the second graph 300B, the y-axis is associated with the active path ID for a second gas (or liquid) stick during a series of recipe operations. The numbers across the top of each graph represents a different recipe operation number, and the x-axis represents time. The first graph 300A and the second graph 300B are examples of graphs made available to an operator within the user interface 108 to track, or by way of report, that the active path ID is changing correctly according to a programmed series of recipe operations.

Figure 4:
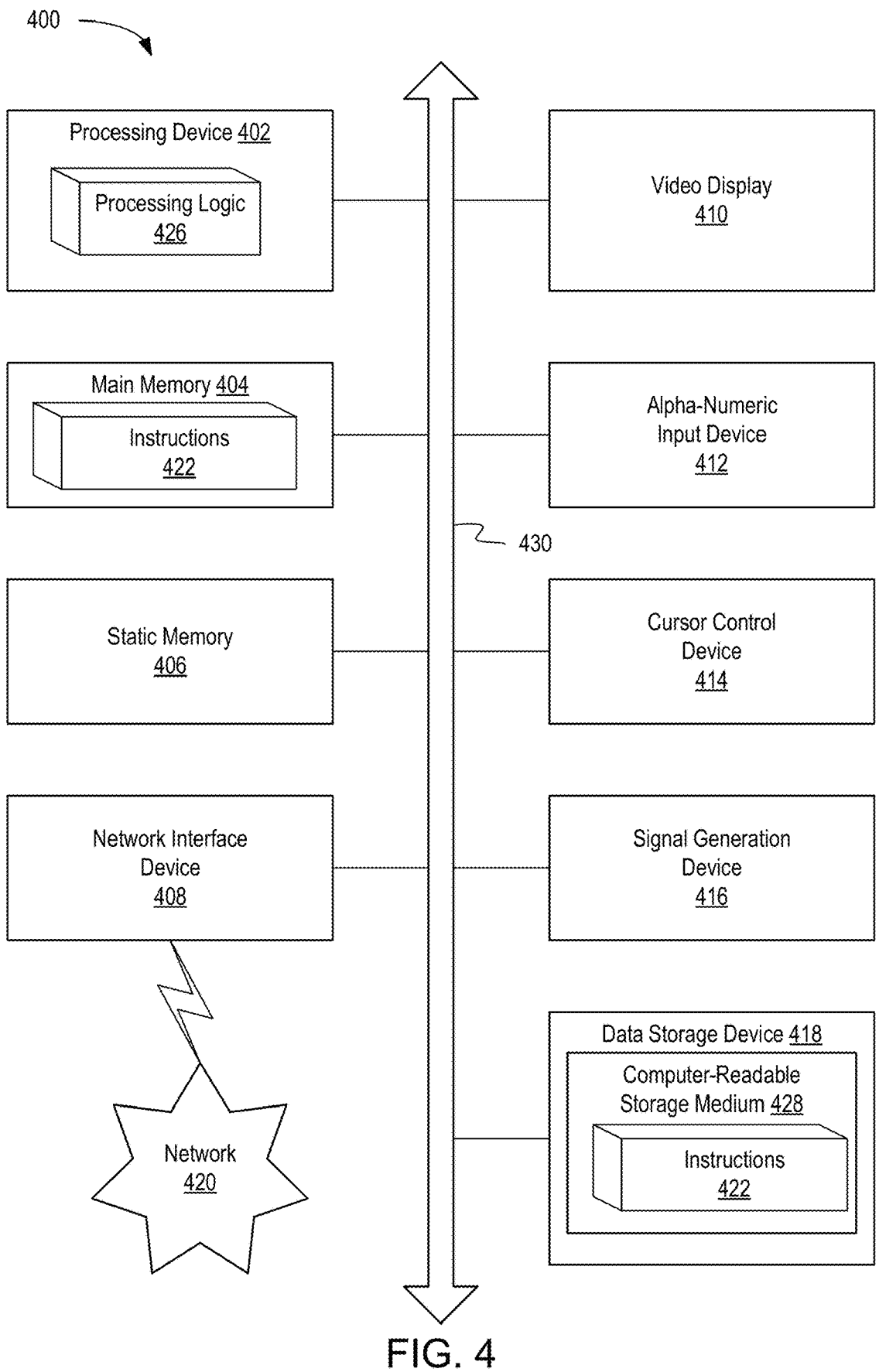
FIG. 4 depicts a block diagram of an example computing device operating in accordance with one or more aspects of the present disclosure and capable of controlling fluid path switching in recipe operations according to various implementations.

FIG. 4 depicts a block diagram of an example computing device 400 operating in accordance with one or more aspects of the present disclosure and capable of controlling fluid path switching in recipe operations according to various implementations. The computing device 400 can be the computing device 102 or a microcontroller of the computing device 102 of FIG. 1A, in one implementation.

Example computing device 400 can be connected to other processing devices in a LAN, an intranet, an extranet, and/or the Internet. The computing device 400 can be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example computing device 400 can include a processing device 402 (e.g., a CPU), a main memory 404 (e.g., read-only memory (ROM), flash memory, dynamic random access memory (DRAM) such as synchronous DRAM (SDRAM), etc.), a static memory 406 (e.g., flash memory, static random access memory (SRAM), etc.), and a secondary memory (e.g., a data storage device 418), which can communicate with each other via a bus 430.

The processing device 402 represents one or more general-purpose processing devices such as a microprocessor, central processing unit, or the like, and include processing logic 426. More particularly, the processing device 402 can be a complex instruction set computing (CISC) microprocessor, reduced instruction set computing (RISC) microprocessor, very long instruction word (VLIW) microprocessor, processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), network processor, or the like. In accordance with one or more aspects of the present disclosure, the processing device 402 can be configured to execute instructions implementing method 200 of process fluid path switching in recipe operations.

Example computing device 400 can further include a network interface device 408, which can be communicatively coupled to a network 420. Example computing device 400 can further include a video display 410 (e.g., a liquid crystal display (LCD), a touch screen, or a cathode ray tube (CRT)), an alphanumeric input device 412 (e.g., a keyboard), an input control device 414 (e.g., a cursor control device, a touch-screen control device, a mouse), and a signal generation device 416 (e.g., an acoustic speaker).

The computing device can include a data storage device 418, including a computer-readable storage medium (or, more specifically, a non-transitory computer-readable storage medium) 428 on which is stored one or more sets of executable instructions 422. In accordance with one or more aspects of the present disclosure, executable instructions 422 can include executable instructions implementing method 300 of monitoring the health of delivery of a liquid in a gaseous state and/or the methods 400 and 500.

Executable instructions 422 can also reside, completely or at least partially, within main memory 404 and/or within processing device 402 during execution thereof by example computing device 400, main memory 404 and processing device 402 also constituting computer-readable storage media. Executable instructions 422 can further be transmitted or received over a network via network interface device 408.

While the computer-readable storage medium 428 is shown in FIG. 4 as a single medium, the term "computer-readable storage medium" (or "non-transitory computer-readable storage medium storing instructions") should be taken to include a single medium or multiple media (e.g., a centralized or distributed database, and/or associated caches and servers) that store the one or more sets of operating instructions. The term "computer-readable storage medium" (or "non-transitory computer-readable storage medium storing instructions") shall also be taken to include any medium that is capable of storing or encoding a set of instructions for execution by the machine that cause the machine to perform any one or more of the methods described herein. The term "computer-readable storage medium" (or "non-transitory computer-readable storage medium") shall accordingly be taken to include, but not be limited to, solid-state memories, and optical and magnetic media.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but can be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above can be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics can be combined in any suitable manner in one or more implementations.

In the foregoing specification, a detailed description has been given with reference to specific exemplary implementations. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplarily language does not necessarily refer to the same implementation or the same example, but can refer to different and distinct implementations, as well as potentially the same implementation.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. A method comprising:
identifying, by a computing device, a set of time values for a length of time to carry out process fluid delivery within multiple processing chambers that concurrently process multiple substrates;
translating, by the computing device, each time value of the set of time values to a recipe parameter for execution of an operation of a processing recipe; and
causing, by the computing device, the operation to be performed using each recipe parameter as a control value to control valves of a fluid panel of the multiple processing chambers, wherein the causing comprises, for each processing chamber of the multiple processing chambers:
causing the process fluid to flow to the processing chamber for a first period of time corresponding to a time value of the set of time values; and
causing the process fluid to flow to a divert foreline of the processing chamber for a second period of time, the second period of time being based on a timestep of the operation and the time value.

2. The method of claim 1, wherein the process fluid is one of a gas or a liquid.

3. The method of claim 1, wherein each recipe parameter is positive, and wherein causing the process fluid to flow to the processing chamber is performed before causing the process fluid to flow to the divert foreline.

4. The method of claim 1, wherein each recipe parameter is negative, and wherein causing the process fluid to flow to the divert foreline is performed before causing the process fluid to flow to the processing chamber.

5. The method of claim 1, wherein, when the recipe parameter is zero, the causing the process fluid to flow to the processing chamber is performed during an entirety of the timestep of the operation of the processing recipe.

6. The method of claim 1, further comprising correlating the set of time values with the process fluid for execution of the operation of the processing recipe.

7. The method of claim 1, wherein a combination of each first period of time and each second period of time equals the timestep of the operation of the processing recipe.

8. The method of claim 1, further comprising:
generating, using the set of time values, the control values and second control values; and
sending the control values and the second control values to a fluid flow controller coupled to a source of the process fluid with which to selectively cause the process fluid to flow during the operation.

9. A system comprising:
a memory; and
a processing device, operatively coupled to the memory, to:
identify a set of time values for a length of time to carry out process fluid delivery within multiple processing chambers that concurrently process multiple substrates;
translate each time value of the set of time values to a recipe parameter for execution of an operation of a processing recipe; and
cause the operation to be performed using each recipe parameter as a control value to control valves of a fluid panel of the multiple processing chambers, wherein, to cause the operation to be performed comprises, for each processing chamber of the multiple processing chambers:
causing the process fluid to flow to the processing chamber for a first period of time corresponding to a time value of the set of time values; and
causing the process fluid to flow to a divert foreline of the processing chamber for a second period of time, the second period of time being based on a timestep of the operation and the time value.

10. The system of claim 9, further comprising, for each processing chamber:
a fluid line coupled to a fluid flow controller, wherein the processing device is further to send the control values to the fluid flow controller;
the divert foreline coupled to the fluid line, the divert foreline to carry the process fluid to an abatement unit; and
the fluid panel comprising the control valves, wherein the control valves comprise:
an isolation valve coupled between the fluid line and the processing chamber; and
a divert valve coupled between the fluid line and the divert foreline.

11. The system of claim 9, wherein each recipe parameter is positive, and wherein causing the process fluid to flow to the processing chamber is performed before causing the process fluid to flow to the divert foreline.

12. The system of claim 9, wherein each recipe parameter is negative, and wherein causing the process fluid to flow to the divert foreline is performed before causing the process fluid to flow to the processing chamber.

13. The system of claim 9, wherein, when the recipe parameter is zero, the causing the process fluid to flow to the processing chamber is performed during an entirety of the timestep of the operation of the processing recipe.

14. The system of claim 9, wherein the processing device is further to:
generate, using the set of time values, the control values and second control values; and
send the control values and the second control values to a fluid flow controller coupled to a source of the process fluid with which to selectively cause the process fluid to flow during the operation.

15. The system of claim 9, wherein a combination of each first period of time and each second period of time equals the timestep of the operation of the processing recipe.

16. A non-transitory computer-readable storage medium storing instructions, which when executed by a processing device, cause the processing device to perform a plurality of operations comprising:
identifying a set of time values for a length of time to carry out process fluid delivery within multiple processing chambers that concurrently process multiple substrates;
translating each time value of the set of time values to a recipe parameter for execution of an operation of a processing recipe; and
causing the operation to be performed using each recipe parameter as a control value to control valves of a fluid panel of the multiple processing chambers, wherein the causing comprises, for each processing chamber of the multiple processing chambers:
causing the process fluid to flow to the processing chamber for a first period of time corresponding to a time value of the set of time values; and
causing the process fluid to flow to a divert foreline of the processing chamber for a second period of time, the second period of time being based on a timestep of the operation and the time value.

17. The non-transitory computer-readable storage medium of claim 16, wherein each recipe parameter is positive, and wherein causing the process fluid to flow to the processing chamber is performed before causing the process fluid to flow to the divert foreline.

18. The non-transitory computer-readable storage medium of claim 16, wherein each recipe parameter is negative, and wherein causing the process fluid to flow to the divert foreline is performed before causing the process fluid to flow to the processing chamber.

19. The non-transitory computer-readable storage medium of claim 16, wherein, when the recipe parameter is zero, the causing the process fluid to flow to the processing chamber is performed during an entirety of the timestep of the operation of the processing recipe.

20. The non-transitory computer-readable storage medium of claim 16, wherein a combination of each first period of time and each second period of time equals the timestep of the operation of the processing recipe, and the plurality of operations further comprise:
  generating, using the set of time values, the control values and second control values; and
  sending the control values and the second control values to a fluid flow controller coupled to a source of the process fluid with which to selectively cause the process fluid to flow during the operation.

* * * * *